US010854796B2

(12) United States Patent
Jayawardena et al.

(10) Patent No.: US 10,854,796 B2
(45) Date of Patent: Dec. 1, 2020

(54) LED LIGHT SYSTEM HAVING ELASTOMERIC ENCAPSULATION

(71) Applicant: Eaton Intelligent Power Limited, Dublin (IE)

(72) Inventors: Adikaramge Asiri Jayawardena, Manlius, NY (US); Andrew Francis Scarlata, West Monroe, NY (US)

(73) Assignee: Eaton Intelligent Power Limited

( * ) Notice: Subject to any disclaimer, the term of this patent is extended or adjusted under 35 U.S.C. 154(b) by 0 days.

(21) Appl. No.: 15/643,861

(22) Filed: Jul. 7, 2017

(65) Prior Publication Data

US 2018/0013041 A1 Jan. 11, 2018

Related U.S. Application Data

(60) Provisional application No. 62/360,001, filed on Jul. 8, 2016.

(51) Int. Cl.
| | |
|---|---|
| *H01L 33/56* | (2010.01) |
| *H01L 33/54* | (2010.01) |
| *H01L 33/62* | (2010.01) |
| *H01L 33/64* | (2010.01) |
| *F21V 23/00* | (2015.01) |
| *F21V 31/00* | (2006.01) |

(Continued)

(52) U.S. Cl.
CPC .............. *H01L 33/56* (2013.01); *F21V 23/007* (2013.01); *F21V 29/74* (2015.01); *F21V 31/00* (2013.01); *H01L 33/54* (2013.01); *H01L 33/62* (2013.01); *H01L 33/647* (2013.01); *H05K 1/0209* (2013.01); *H05K 3/284* (2013.01); *F21K 9/90* (2013.01); *F21V 29/77* (2015.01);
*F21Y 2115/10* (2016.08); *H01L 25/0753* (2013.01); *H01L 2933/005* (2013.01); *H05K 3/285* (2013.01); *H05K 2201/0133* (2013.01); *H05K 2201/066* (2013.01); *H05K 2201/10106* (2013.01)

(58) Field of Classification Search
CPC ......... H01L 33/56; H01L 33/54; F21V 31/00; F21V 31/005; F21V 19/002; H05K 1/0209

See application file for complete search history.

(56) References Cited

U.S. PATENT DOCUMENTS

| | | |
|---|---|---|
| 6,354,714 B1 | 3/2002 | Rhodes |
| 6,614,103 B1 * | 9/2003 | Durocher ............... H01L 23/13 |
| | | 257/103 |

(Continued)

FOREIGN PATENT DOCUMENTS

| | | |
|---|---|---|
| EP | 2 190 040 A2 | 5/2020 |
| JP | 2014-199958 A | 10/2014 |

(Continued)

OTHER PUBLICATIONS

International Search Report and Written Opinion for Application No. PCT/US2017/041095 dated Oct. 13, 2017.

(Continued)

*Primary Examiner* — Lex H Malsawma
*Assistant Examiner* — Laura M Dykes
(74) *Attorney, Agent, or Firm* — Merchant & Gould P.C.

(57) ABSTRACT

A light system includes a first substrate and a second substrate having the first substrate thereon. A light emitting diode (LED) is connected to the first substrate. An encapsulation layer covers the LED and at least a majority of the first substrate.

18 Claims, 4 Drawing Sheets

(51) Int. Cl.
*H05K 1/02* (2006.01)
*F21V 29/74* (2015.01)
*H05K 3/28* (2006.01)
*H01L 25/075* (2006.01)
*F21V 29/77* (2015.01)
*F21Y 115/10* (2016.01)
*F21K 9/90* (2016.01)

(56) References Cited

U.S. PATENT DOCUMENTS

| | | | |
|---|---|---|---|
| 8,029,162 B2 | 10/2011 | Curran et al. | |
| 8,269,245 B1 | 9/2012 | Shum | |
| 8,575,646 B1* | 11/2013 | Shum | H01L 33/54 |
| | | | 257/100 |
| 8,957,440 B2 | 2/2015 | Ibbetson et al. | |
| 9,433,825 B1* | 9/2016 | Nguyen | A63B 31/11 |
| 2006/0186423 A1* | 8/2006 | Blonder | H01L 25/0753 |
| | | | 257/98 |
| 2008/0023711 A1* | 1/2008 | Tarsa | H01L 33/486 |
| | | | 257/98 |
| 2008/0048200 A1* | 2/2008 | Mueller | B29C 41/14 |
| | | | 257/98 |
| 2008/0265781 A1* | 10/2008 | Lin | F21K 9/00 |
| | | | 315/113 |
| 2010/0127288 A1* | 5/2010 | Kuo | H01L 33/483 |
| | | | 257/98 |
| 2011/0090688 A1* | 4/2011 | Lai | F21V 5/007 |
| | | | 362/235 |
| 2012/0175643 A1* | 7/2012 | West | H01L 33/62 |
| | | | 257/88 |
| 2012/0235190 A1* | 9/2012 | Keller | H01L 33/56 |
| | | | 257/98 |
| 2013/0308320 A1* | 11/2013 | Kawahara | F21V 5/04 |
| | | | 362/311.09 |
| 2013/0314931 A1* | 11/2013 | Lin | H01L 25/0753 |
| | | | 362/382 |
| 2014/0070702 A1* | 3/2014 | Hsin | F21V 29/58 |
| | | | 315/113 |
| 2014/0091329 A1 | 4/2014 | Lee et al. | |
| 2014/0168975 A1* | 6/2014 | Ng | F21V 5/007 |
| | | | 362/244 |
| 2014/0177226 A1* | 6/2014 | Goelz | F21V 31/005 |
| | | | 362/294 |
| 2014/0268763 A1 | 9/2014 | Duckworth | |
| 2015/0048407 A1 | 2/2015 | Peil et al. | |
| 2015/0252976 A1* | 9/2015 | Sun | F21V 17/005 |
| | | | 362/267 |
| 2016/0247983 A1* | 8/2016 | Mutschelknaus | H01L 33/56 |
| 2018/0066815 A1* | 3/2018 | Chen | F21V 31/005 |

FOREIGN PATENT DOCUMENTS

| | | |
|---|---|---|
| JP | 2015-002032 A | 1/2015 |
| KR | 10-2008-0058645 A | 6/2008 |
| KR | 10-2010-0094396 A | 8/2010 |
| KR | 10-2013-0119907 A | 11/2013 |
| WO | WO-2004070839 A2 * | 8/2004 ............... F21K 9/00 |
| WO | 2013/178596 A1 | 12/2013 |
| WO | 2014/044479 A1 | 3/2014 |

OTHER PUBLICATIONS

Extended European Search Report for Application No. 17824976.9 dated Mar. 3, 2020.

* cited by examiner

LED LIGHT SYSTEM HAVING ELASTOMERIC ENCAPSULATION

CROSS-REFERENCE

This application is a U.S. Nonprovisional application claiming the benefit of U.S. Provisional Patent Application Ser. No. 62/360,001, filed on Jul. 8, 2016, which is incorporated by reference in its entirety.

BACKGROUND

Lighting systems that use light emitting diodes (LED) as a light source are becoming increasingly popular in many lighting applications. Some applications for LED-based light fixtures include hazardous environments where electrical and thermal abnormalities must be avoided to prevent explosion or fire hazards.

Some known LED fixture designs have an optical chamber that includes an LED light source, secondary beam shaping refractive optics, a polycarbonate or glass cover, a gasket, and sealant/adhesive for attaching and sealing the light source to the fixture enclosure. Having many different layers adds complexity to the assembly process.

SUMMARY

In accordance with certain aspects of the present disclosure, a light system includes a first substrate with a light emitting diode (LED) connected to a surface of the first substrate. An encapsulation layer directly contacts and covers the LED and at least a majority of the surface of the first substrate. In some examples, the first substrate is a printed circuit board (PCB) that is attached to a second substrate such as a heat sink substrate. The encapsulation layer is formed of an elastomeric material such as silicone, and the encapsulation may include optic characteristics molded therein.

In accordance with further aspects of the present disclosure, a method of making a light fixture includes providing an LED on a first substrate, and attaching the first substrate to a second substrate. An encapsulation layer is over molded to cover the LED and at least a majority of the first substrate. In some examples, the encapsulation layer is clamped to the first substrate with the gasket positioned between the encapsulation layer and the second substrate. The over molding process may include positioning a mold over the first and second substrates, and injecting an elastomeric material such as silicone into a cavity formed by the mold and the first and second substrates. The over molding process may further include forming optical characteristics in the encapsulation.

DETAILED DESCRIPTION

In the following Detailed Description, reference is made to the accompanying drawings, which form a part hereof, and in which is shown by way of illustration specific examples in which the invention may be practiced. It is to be understood that other examples may be utilized and structural or logical changes may be made without departing from the scope of the present invention. The following detailed description, therefore, is not to be taken in a limiting sense.

Some known light fixtures that use light emitting diodes (LEDs) as a light source include an LED light source, a lens for providing secondary beam shaping refractive optics, polycarbonate or glass cover, a gasket, and sealant/adhesive. LED fixtures having several material layers can be problematic. For example, multiple layers—each with different refractive indexes—that light has to refract can result in higher refractive losses in the system. Further, manufacturing tolerances of these multiple layers can impact the light distribution pattern and also make assembly complicated. Still further, having different material layers around the periphery of the fixture for ingress protection and restrictive breathing purposes may increase fatigue on a sealing gasket, which overtime could weaken the restrictive breathing properties of the fixture.

In some examples disclosed herein, the secondary optics and/or poly carbonate/glass cover are replaced with an elastomeric encapsulation layer that includes optical characteristics. In some embodiments, a silicone-based optical layer is used. A desired optical pattern, such as a three-dimensional geometrical pattern, is molded into the encapsulation layer to achieve the desired optical distribution pattern. The encapsulation layer provides the desired surface contact to minimize an air gap between the surface of the LED and the inner surface of the encapsulation. For example, the encapsulation layer may include a free-form lens design molded into the encapsulation layer to produce a predetermined roadway light distribution pattern as defined by the Illuminating Engineering Society of North America (IESNA).

The provision of the optical encapsulating layer shields the optics from environmental elements such as water and dust, thus eliminating the need for a separate glass or plastic cover. In some examples, the encapsulation material including the molded optics is attached to the LED substrate using a silicone based adhesive. The encapsulation material, which may be a silicone-based material, and the adhesive satisfy the restrictive breathing and ingress protection requirements of the fixture. This can significantly reduce the number of components required for the fixture, eliminating the need for items such as bezel lenses, retainers, gaskets, and associated fasteners.

Figure 1:
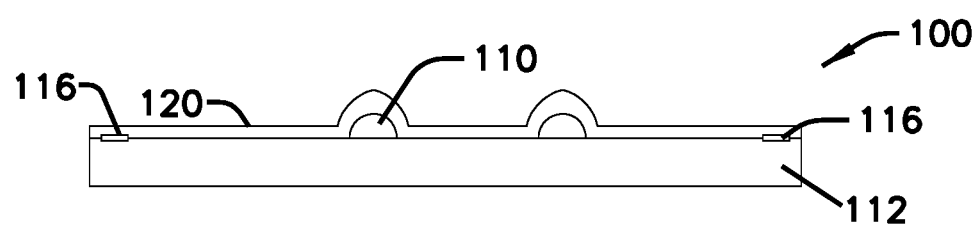
FIG. 1 is a schematic side view illustrating an example of an LED system in accordance with aspects of the present disclosure.

FIG. 1 conceptually illustrates portions of an LED system 100 in accordance with aspects of the present disclosure. The LED system 100 includes one or more LEDs 110 on a substrate 112. In some examples, the substrate 112 is an LED substrate that may include a printed circuit board (PCB) assembly that provides the necessary electrical connections to the LEDs 110 and other electrical components of the system 10. The substrate 112 is typically connected to a heat sink device. In other examples, the substrate 112 is a heat sink substrate having the LEDs 110 and other components mounted directly thereto.

An encapsulation layer 120 covers at least a majority of the top surface of the substrate 112, including the LEDs 110. The encapsulation layer shown in FIG. 1 covers the entire top surface of the substrate 112. In some examples, the encapsulation layer 120 is formed of an elastomeric material such as silicone or high impact resistant polymers such as polycarbonate based variants. The elastomeric encapsulation material may be a clear or diffused or tinted with a colored additive. Examples of suitable silicone substances include Loctite 5600 Silicone, Loctite Superflex RTV, and Loctite E-30CL 2-part epoxy from Henkel Corporation. The encapsulation layer 120 in some embodiments includes optic characteristics, such as total internal reflection (TIR) optics characteristics. For instance, the silicone encapsulating materials may be molded into optical shapes. Further, diffusing material may be added into the encapsulation material in some implementations, or the encapsulation 120 may be tinted to modify the light spectrum. Still further, the outer optic surface may be textured to diffuse the light and reduce glare. By including optical characteristics in the molded encapsulation 120, the need for an additional lens is eliminated in some implementations.

Thus, rather than only provide an optical layer over the LEDs 110, the encapsulation layer 120 directly contacts and covers the LEDs 110, as well as surfaces of the substrate 112 that do not have LEDs mounted thereon. In this manner, the encapsulation layer 120 provides a contiguous cover directly on the substrate 112 and LEDs 110, protecting the system 100 from elements such as impacts, corrosion, moisture, etc.

Figure 2:
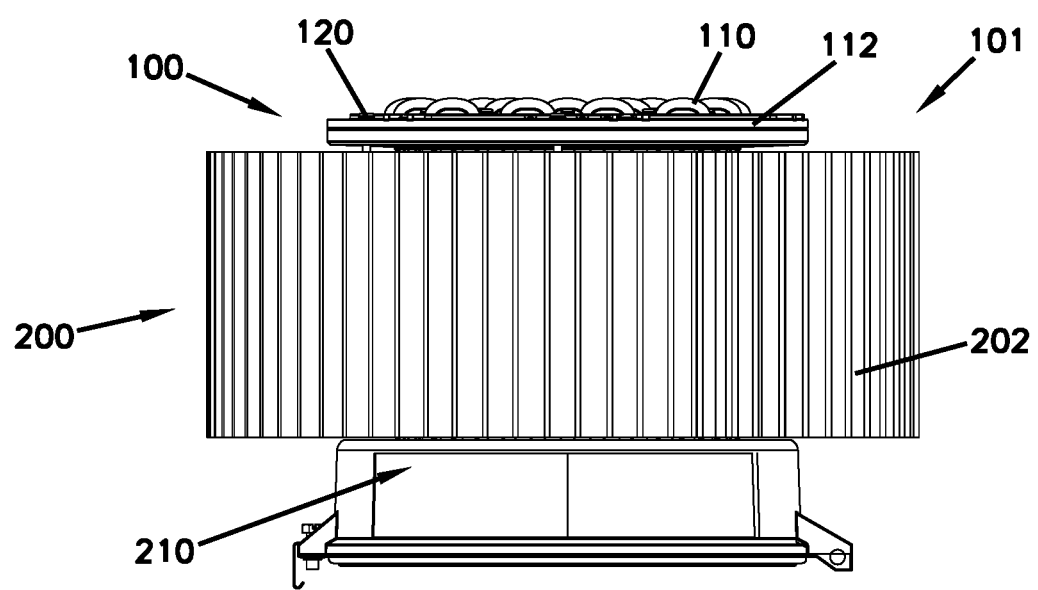
FIG. 2 is a side view illustrating an example LED light fixture in accordance with aspects of the present disclosure.
Figure 3:
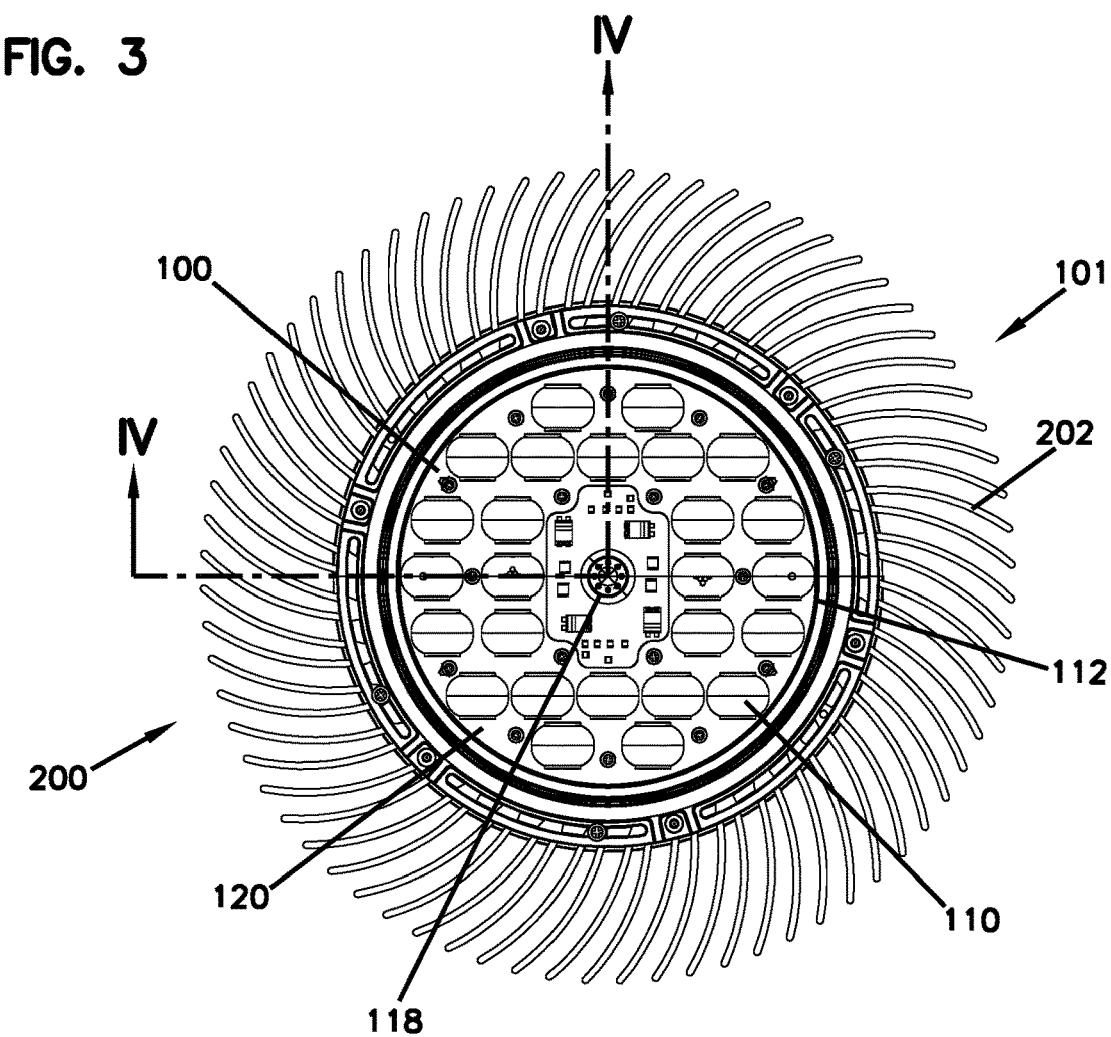
FIG. 3 is a top view of the LED light fixture shown in FIG. 2.

FIG. 2 is a side view, and FIG. 3 is a top view illustrating an example light fixture 101 incorporating another example of the LED system 100. The illustrated fixture 101 includes the LED system 100 attached to a heat sink assembly 200 that has a plurality of heat sink fins 202 extending therefrom. A driver compartment 210 houses a driver assembly, which includes a power supply for the fixture 101. The LEDs 110 are shown arranged generally in rows on the substrate 112, though any pattern of LEDs may be employed to achieve the desired light output.

Figure 4:
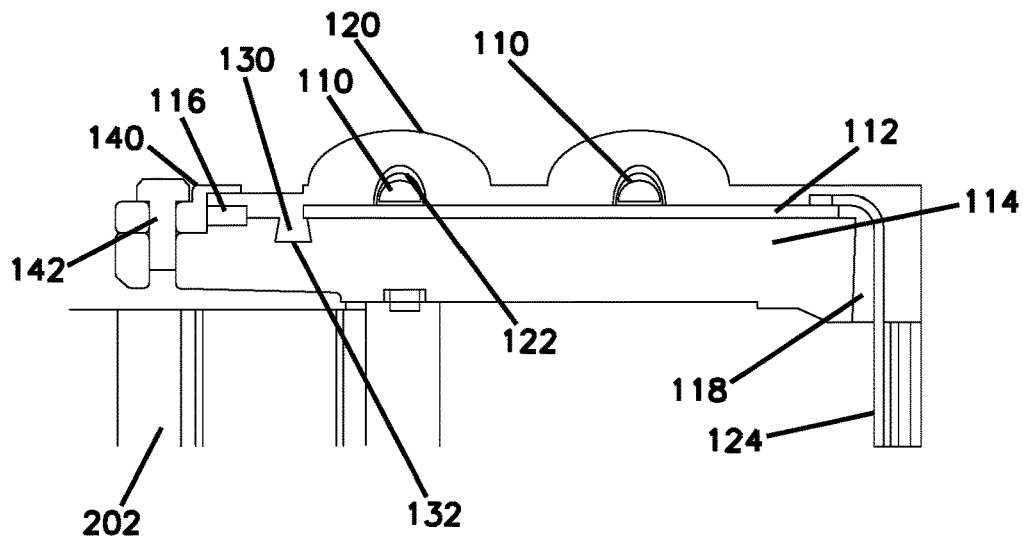
FIG. 4 is a partial section view of a portion of an example LED system used in the LED light fixture shown in FIGS. 2 and 3, including a co-molded optic and gasket that are inseparably molded.

FIG. 4 is a close up, partial section view taken along line Iv-Iv of FIG. 3, illustrating aspects of the LED system 100. The LED system 100 includes a pattern of LEDs 110 on a first substrate 112. In the embodiment shown in FIG. 4, the first substrate 112 is an LED substrate that may include a printed circuit board (PCB) assembly that provides the necessary electrical connections to the LEDs 110 and other electrical components of the system 100. The LED substrate 112 is situated on a second substrate 114, which is a heat sink substrate in the illustrated example. The heat sink substrate 114 includes a center hub 118 that provides a routing for conductors such as wires 124 to extend from the LED substrate 112 to the driver compartment 210.

An encapsulation layer 120 covers the LED substrate 112 and the heat sink substrate 114. As noted above, the encapsulation layer 120 may be formed of silicone. A gasket 116 extends around a periphery of the heat sink substrate 114 and is positioned between the heat sink substrate 114 and the encapsulation layer 120. In the example shown in FIG. 4, the encapsulation layer 120 is positioned directly on, and entirely covers the surface of the LED substrate 112, as well as the LEDs 110 mounted on the substrate 112. Thus, even portions of the top surface of the LED substrate 112 not having an LED 120 mounted thereon are covered by the encapsulation layer 120. The encapsulation layer thus acts as a protection layer against corrosion and humidity, protecting the entire upper surface of the LED system 100. In some examples the encapsulation layer 120 defines an air gap 122 between the LED 110 and an interior surface of the encapsulation layer 120, while in other examples there is no air gap between the LEDs 110 and the encapsulation layer 120.

In the example shown in FIG. 4, the encapsulation layer further covers and seals the center hub 118, as well as the wires 124 and other components extending therethrough. In some embodiments, this eliminates the need for a separate seal for the center hub 118. The encapsulation layer 120 further covers connectors, wires, and other components supported by the LED substrate 112 and/or heat sink substrate 114. In this manner, "loose" components such as those not easily mounted to the substrates 112, 114 (antennas, sensors, wires, etc.) are embedded into the encapsulation layer 120 to fix these components in place and protect them from external elements.

In some implementations, one or both of the LED substrate 112 and the heat sink substrate 114 contain features such as grooves to facilitate the flow of the encapsulant, such as silicone, to help bind the encapsulation layer to the LED substrate 112 and/or the heat sink substrate 114. The LED system 100 shown in FIG. 4 includes one or more locking tabs 130 extending from the encapsulation layer 120. A locking opening 132 is defined by the second substrate 114 and receives the locking tab 130 to secure the encapsulation layer 120 over the first and second substrates 112, 114. In some embodiments, the encapsulation layer 114, and more particularly the locking tab 130 has a durometer that is different than the durometer of the gasket 116. For example, the durometer of the locking tab 114 may be higher than that of the gasket 116, so that the locking tab 130 exhibits the desired strength to securely hold the encapsulation layer in place, while the softer gasket 116 may satisfactorily deform to perform its sealing function. In some implementations the durometer of the locking tab 130 is 1.5 to 2 times the durometer of the gasket 116 material. For example, the material of the encapsulation layer 120 has a durometer of about 60-90, while the material of the gasket 116 has a durometer of about 40-50.

The encapsulation 120 may be fabricated by different processes. For example, in some implementations, the encapsulation 120 is formed by a molding process wherein the encapsulation 120, including any optic characteristics, as well as the locking tab 130 are integrally formed using an injection molding process with a closed mold. Once the encapsulation 120 and locking tab 130 are formed, the locking tab 130 is pressed by force into the locking opening 132 formed in the heat sink substrate 114 and/or the LED substrate 112. The lower durometer gasket 116 in such embodiments is co-molded with the higher durometer material forming the encapsulation 120 and locking tab 130. Clamping hardware such as a clamp 140 and bolt 142 may be employed to ensure sufficient contact between the substrates 112, 114, the gasket 116 and the encapsulation 120.

In some embodiments discussed further below, the encapsulation layer 120 is overmolded directly onto the first substrate 112, eliminating the need for the gasket 116 and clamping hardware 140, 142. In other embodiments, the gasket 116 is formed separately from the encapsulation 120, and positioned around the periphery of the heat sink substrate 114 prior to clamping the encapsulation to the heat sink substrate 114.

In still further examples, the encapsulation 120 and locking tab 130 are formed using an over mold process. The LED substrate 112 and heat sink substrate 114 are pre-assembled and function as a bottom portion of a mold used to form the encapsulation 120, 116 and locking tab 130. The upper half of the mold, which includes any desired optical characteristics, seals against the preassembled components, forming a cavity into which the silicone or other material is injected to form the elastomeric components. The LED substrate 112 and/or heat sink substrate 114 may include features such as grooves or other openings to facilitate flow the encapsulation material and bond the substrates 112, 114 to one another.

Figure 5:
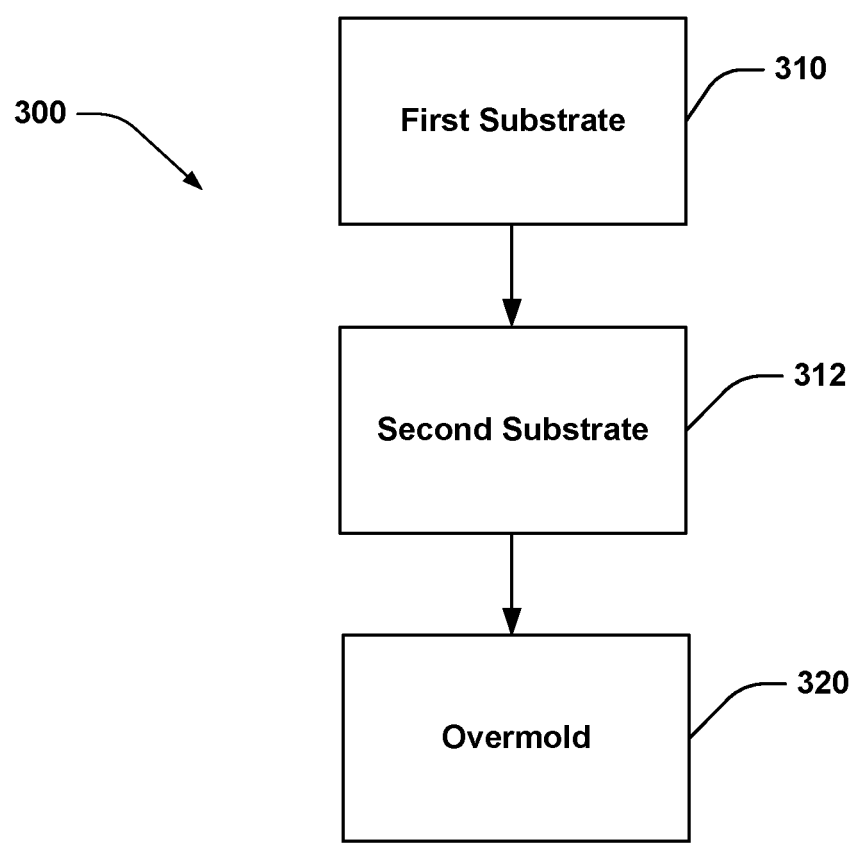
FIG. 5 is a flow diagram illustrating an example of a process for making an LED system such as that shown in FIG. 1.

FIG. 5 is a flow diagram illustrating an example of a method 300 of making an LED light fixture. In block 310 of FIG. 5, a first substrate (such as the LED substrate 112 shown in FIG. 1) is provided to which an LED and other components and conductors are attached. The first substrate is placed adjacent a second substrate (such as the heat sink substrate 114) in block 312. In block 320, an encapsulation layer (such as the encapsulation 120) is molded and positioned to cover the LED and at least a majority of the first substrate. In the example shown in FIG. 4, the gasket 116 may be co-molded with the encapsulation layer and positioned so as to surround around a periphery of the first substrate. In embodiments where the encapsulation is over-molded, the encapsulation layer is directly molded onto the first substrate, eliminating the need for a gasket since a seal is achieved through the bond between the encapsulation material and the substrate.

Figure 6:
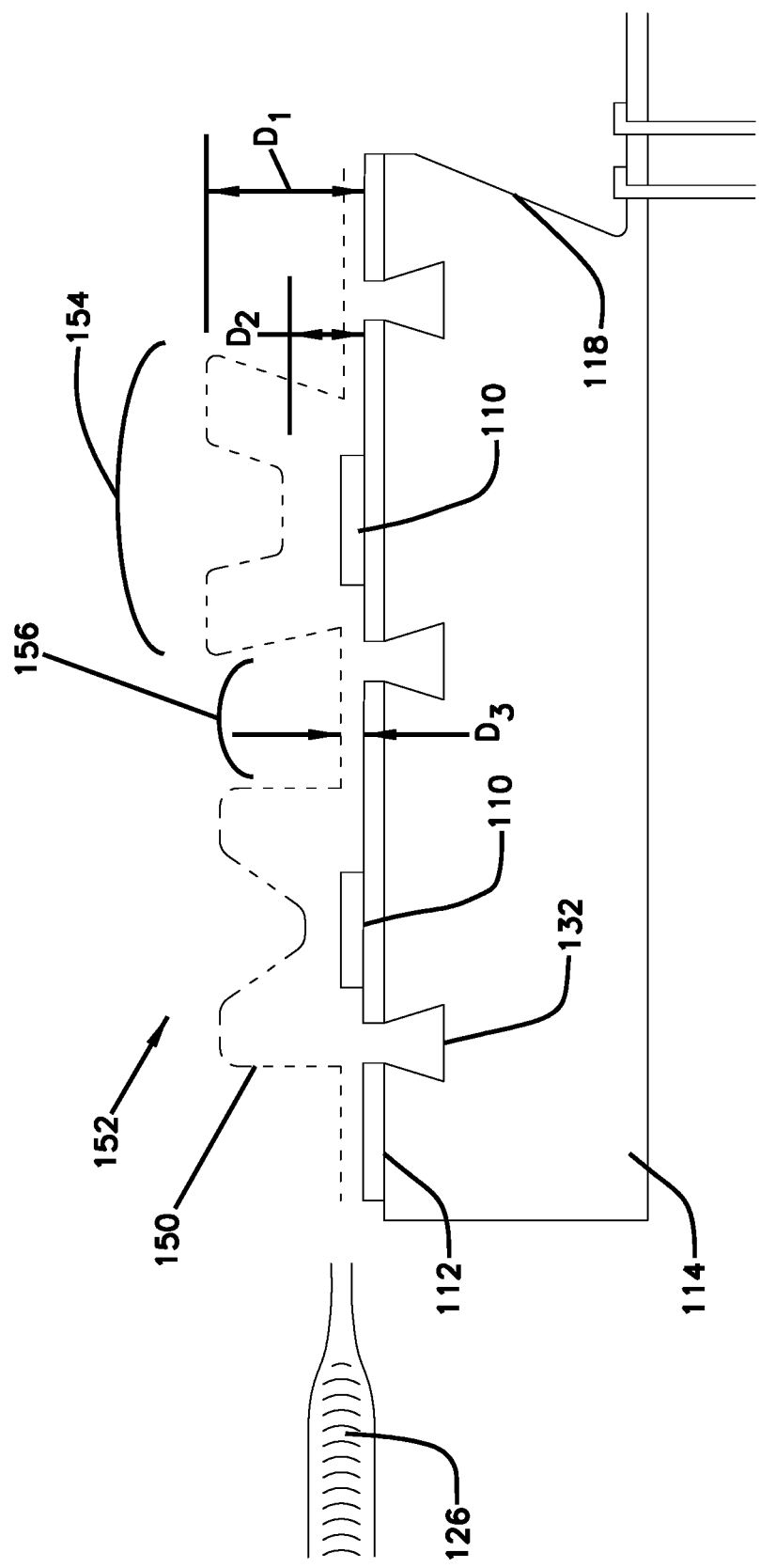
FIG. 6 illustrates an over mold suitable for use in the process shown in FIG. 5.

FIG. 6 illustrates an example of an over mold 150 suitable for forming the encapsulation 120. The over mold 150 is placed over the preassembled first and second substrates 112, 114, and an encapsulation material 126, such as silicone, is injected into the mold formed by the over mold 150 and substrates 112, 114. The over mold 150 may include features that result in the formed encapsulation 120 having optical features configured to shape light from the LEDs 110 through refraction. In some embodiments, the over mold 150 is configured such that the encapsulation material flows over and encapsulates components in addition to the LEDs 120, such as wires 124 and other conductors and connectors extending through the central hub 118, achieving restricted breathing as desired. In some embodiments, this eliminates the need for separately sealing the central hub 118, such as by another potting compound.

The locking tabs 130 shown in FIG. 4 are formed when the encapsulation materials flows into the locking openings 132 during the injection molding process. The mold 154 may be heated to achieve better fluidity of the encapsulation material, allowing 98-99% of the volume between the LED 110 and mold to be filled with the encapsulation material. In some embodiments, the clamping device 140, 142 is further provided to further connect the encapsulation material to the substrates 112, 114.

In the example shown in FIG. 6, the over mold includes geometric and volumetric features 152 that control emissions from the LED 110 to refract and form desired distribution patterns. The mold 150 further is shaped to vary the thickness of the encapsulation layer 120 to generate desired secondary optics. For example, portions 154 of the encapsulation layer 120 positioned directly over and around corresponding LEDs 110 defines different thicknesses extending above the substrate 112. As shown in FIG. 6, the mold 150 is formed such that the portion 154 of the encapsulation layer 120 has one thickness extending a first distance $D_1$ above the substrate 112, and another thickness extending a second distance $D_2$ above the substrate. Moreover, the encapsulation layer 120 defines a third thickness in areas encapsulating portions of the surface of the substrate 112 were there is no LED 110 on the substrate 112, such as area 156 shown in FIG. 6. The thickness of the encapsulation 120 formed in the area 156 of the encapsulation 120 is defined by a third distance $D_3$ above the substrate, that is less than both distances $D_1$ and $D_2$. Thus, the encapsulation 120 defines various thicknesses, and in the example shown in FIG. 6, the encapsulation 120 has greater thickness(es) in areas where an LED 110 is encapsulated. These different geometries are created so that incidence angles and path length of light within the material can be altered to achieve different light distribution patterns.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A light system, comprising:
a first substrate;
a second substrate having the first substrate thereon, the first and second substrates defining a hub therethrough;
a plurality of light emitting diodes (LED) connected to a surface of the first substrate;
the first and second substrates defining respective first and second locking openings therein;
an elastomeric encapsulation layer covering and directly contacting the plurality of LEDs and at least a majority of the surface of the first substrate, the elastomeric encapsulation layer including a locking tab integrally formed therewith and extending through the first locking opening into the second locking opening to fill the second locking opening and fasten the elastomeric encapsulation layer to the surface of the first substrate;
a gasket extending around a periphery of the first substrate to surround the plurality of LEDs, the gasket being positioned between the first substrate and the elastomeric encapsulation layer such that the elastomeric encapsulation covers the entire gasket; and
a driver assembly electrically connected to the first substrate by a conductor extending from the first substrate through the hub to the driver assembly;
wherein the elastomeric encapsulation layer covers and extends into the hub and the conductor is embedded in the encapsulation layer; and
wherein the elastomeric encapsulation layer defines an air gap between the plurality of LEDs and an interior surface of the elastomeric encapsulation layer.

2. The system of claim 1, wherein the elastomeric encapsulation layer is formed of silicone.

3. The system of claim 1, wherein the elastomeric encapsulation layer includes optic characteristics.

4. The system of claim 3, wherein the elastomeric encapsulation layer includes total internal reflection (TIR) optics.

5. The system of claim 1, wherein the gasket has a first durometer and the locking tab has a second durometer that is higher than the first durometer.

6. The system of claim 5, wherein the second durometer is about 1.5 times the first durometer.

7. The system of claim 5, wherein the second durometer is about 2 times the first durometer.

8. The system of claim 1, wherein there is no lens over the plurality of LEDs in addition to the elastomeric encapsulation layer.

9. The system of claim 1, wherein the gasket is integrally formed with the elastomeric encapsulation layer.

10. The system of claim 1, wherein the elastomeric encapsulation layer covers the entire surface of the first substrate.

11. The system of claim 1, wherein the elastomeric encapsulation layer has a first thickness in first areas covering the plurality of LEDs and a second thickness in a second area covering a portion of the surface having no LEDs, wherein the first thickness is greater than the second thickness.

12. The light system of claim 1, wherein the first substrate is a PCB and the second substrate is a heat sink.

13. The system of claim 12, further comprising heat sink fins attached to the second substrate.

14. A method of making a light fixture, comprising:
providing a plurality of LEDs on a first substrate, the first substrate defining a first locking opening therein;
situating the first substrate on a second substrate, the second substrate defining a second locking opening therein, the first and second substrates defining a hub therethrough;
electrically connecting a driver assembly to the first substrate by a conductor extending from the first substrate through the hub to the driver assembly;
forming a gasket extending around a periphery of the first substrate to surround the plurality of LEDs;
positioning a mold over the first substrate and the plurality of LEDs; and
injecting silicone into a cavity formed by the mold and the first substrate to form an elastomeric encapsulation layer covering the plurality of LEDs and an entire top surface of the first substrate,
wherein the silicone fills the first and second locking openings to form a locking tab extending from the elastomeric encapsulation layer though the first locking opening and into the second locking opening to fasten the elastomeric encapsulation layer to the first substrate,
wherein the gasket is positioned between the first substrate and the elastomeric encapsulation layer such that the elastomeric encapsulation covers the entire gasket;
wherein the elastomeric encapsulation layer covers and extends into the hub and the conductor is embedded in the encapsulation layer; and
wherein the elastomeric encapsulation layer defines an air gap between the plurality of LEDs and an interior surface of the elastomeric encapsulation layer.

15. The method of claim 14, wherein the second substrate is a heat sink substrate.

16. The method of claim 14, wherein over molding includes forming optical characteristics in the elastomeric encapsulation layer.

17. The method of claim 15, further comprising attaching heat sink fins to the second substrate.

18. The method of claim 14, further comprising heating the mold.

\* \* \* \* \*